United States Patent [19]
Haskell et al.

[11] Patent Number: 5,776,821
[45] Date of Patent: Jul. 7, 1998

[54] METHOD FOR FORMING A REDUCED WIDTH GATE ELECTRODE

[75] Inventors: Jacob Haskell, Palo Alto; Satyendra Sethi, Pleasonton; Calvin Todd Gabriel, Cupertino, all of Calif.

[73] Assignee: VLSI Technology, Inc., San Jose, Calif.

[21] Appl. No.: 916,696

[22] Filed: Aug. 22, 1997

[51] Int. Cl.$^6$ ................................ H01L 21/3205
[52] U.S. Cl. .............. 438/585; 438/592; 438/197; 438/595; 438/684; 438/770
[58] Field of Search ................ 438/585, 591, 438/592, 595, 666, 658, 671, 764, 770, 684

[56] References Cited

U.S. PATENT DOCUMENTS

| | | |
|---|---|---|
| 4,239,559 | 12/1980 | Ito . |
| 4,358,340 | 11/1982 | Fu . |
| 4,378,627 | 4/1983 | Jambotkar . |
| 4,432,132 | 2/1984 | Kinsbron et al. . |
| 4,460,435 | 7/1984 | Maa . |
| 4,707,218 | 11/1987 | Giammarco et al. . |
| 4,801,350 | 1/1989 | Mattox et al. . |
| 4,869,781 | 9/1989 | Euen et al. . |
| 4,897,364 | 1/1990 | Nguyen et al. . |
| 5,200,358 | 4/1993 | Bollinger et al. . |
| 5,210,435 | 5/1993 | Roth et al. . |
| 5,318,922 | 6/1994 | Lim et al. . |
| 5,444,003 | 8/1995 | Wang et al. . |
| 5,476,802 | 12/1995 | Yamazaki et al. . |
| 5,525,542 | 6/1996 | Maniar et al. . |

Primary Examiner—Charles L. Bowers, Jr.
Assistant Examiner—Lynne A. Gurley
Attorney, Agent, or Firm—Woodard,Emhardt,Naughton,Moriarty & McNett

[57] ABSTRACT

A method for fabricating a semiconductor integrated circuit structure having a reduced width gate electrode. A pre-gate electrode having a width is first delineated by conventional lithography techniques. The conductive layer is partially etched to expose a first and second pre-gate side wall. With the pre-gate side walls exposed, the structure is oxidized to grow an oxide layer on the pre-gate side walls, thereby consuming a predetermined amount of the conductive material. The newly formed oxide layer is then removed to reduce the pre-gate width while retaining at least a portion of an oxide layer above the conductive layer as a mask. The reduced width gate electrode is completed by etching the remaining unmasked conductive layer.

26 Claims, 3 Drawing Sheets

METHOD FOR FORMING A REDUCED WIDTH GATE ELECTRODE

BACKGROUND OF THE INVENTION

The present invention relates to a fabrication technique for obtaining micron and submicron line widths or other submicron patterns useful in the fabrication of microelectronic devices, particularly field effect transistor (FET) gates.

During the past several years there has been a continuing trend toward the development of microelectronic devices having ever greater density. Particularly in the area of metal oxide semiconductor (MOS) memories and microprocessors, development efforts have continued to achieve increased density of active elements, which has led to dramatically increased operational speeds. As used herein, a "Metal Oxide Semiconductor" or "MOS" broadly refers to an insulator/conductor arrangement, where the insulator may be an oxide, nitride, or other insulator common to semiconductor manufacturing, and the conductor may be a metal, metallic alloy, silicide, doped semiconductor or such other conductor common to semiconductor manufacturing.

Most of the expense in producing these semiconductor devices is incurred in the designing, testing, handling, bonding and packaging processes rather than in the cost of the semiconductor itself. Thus, any circuit which can be contained on a chip of a given size will cost about the same as any other. So long as reasonable yields are achieved, large economies in the cost per circuit element can result by increasing the number of circuit elements per unit of chip area.

A major reason for recent progress has been the development of ever smaller more reliable field effect structures, coupled with more sophisticated design techniques. However, conventional photolithographic techniques are approaching the limit of their ability to provide smaller circuit element geometries. Accordingly, there has been intense development activity in the area of electron beam lithography (E-beam), which is known to have a capability to reduce device geometries beyond the limits of conventional photolithography. However, use of E-beam lithography and other advanced lithography techniques result in much more expensive chip processing due to the high cost of the equipment involved. Further, use of advanced lithography techniques often results in a very low through-put as a result of slow process speeds.

In current integrated circuit technology it is desirable to obtain line widths in the range of approximately 0.5 µm by using standard photolithography techniques, and to avoid the application of more complex techniques such as E-beam or X-ray lithography. Recently, there has been an effort in the integrated circuit field to develop processes for making submicrometer channel length field effect transistors with a high degree of channel length control. Examples of this work are described in U.S. Pat. Nos. 4,869,781 filed Oct. 17, 1988, and 5,476,802 filed May 27, 1994. These patents disclose the application of standard masking and etching techniques to define a pre-gate width. Using the established mask, the unmasked polycrystalline silicon layer is entirely removed down to the underlying gate oxide layer. After this step, the mask material is removed and an oxide layer is grown on the polycrystalline silicon layer, thus consuming a portion of its exterior surfaces. The newly formed oxide layer is then removed to reveal a reduced height and reduced width polycrystalline silicon gate electrode above the gate oxide. However, because the gate oxide layer is exposed after the polycrystalline silicon etch, isotropic etching to remove the newly formed oxide layer may also result in removal of a portion of the gate oxide layer under the polycrystalline silicon gate electrode, i.e. undercutting the gate. Such undercutting of the gate electrode adversely affects gate performance. Should anisotropic etching be used to remove the newly formed oxide, the underlying gate oxide will likely be entirely removed, with possible damage to the underlying silicon substrate during the etching process.

Accordingly, there is a continuing need for new techniques that are capable of providing submicron resolutions consistent with the yields that are required for economic feasibility and that limit damage to previously formed chip layers.

SUMMARY OF THE INVENTION

It is an object of the present invention to fabricate microelectronic structures having micron or submicron line widths, necessary to increase circuit densities beyond the limits of an applied lithographic technique.

A specific object of the present invention is to provide a method for forming a gate electrode, comprised of providing a gate oxide with a conductive layer deposited thereon, generating a mask over the conductive layer delineating a gate electrode pattern having a width, partially etching the unmasked conductive layer to expose at least a portion of a side wall defined in the conductive layer, oxidizing the conductive layer to form an oxide layer of a predetermined thickness after the partial etching, removing the oxide layer to expose the conductive layer, and etching the conductive layer to define a reduced width gate electrode.

Still a further object of the present invention is to provide a method for forming a gate electrode, comprised of providing an insulating layer, a conductive layer, a first oxide layer, and a maskant layer. The maskant layer is patterned to generate a mask on the first oxide layer, thereby delineating a gate electrode pattern having a first width. The unmasked area of the first oxide layer is then etched to reveal the underlying conductive layer. The conductive layer is partially etched to remove a portion of its thickness, thereby defining at least a portion of a side wall in the conductive layer. The conductive layer is then oxidized to form a second oxide layer of a predetermined thickness thus consuming a portion of the conductive layer. After its formation, the second oxide layer is removed to expose the underlying polycrystalline silicon layer while leaving intact at least a portion of the first oxide layer. Etching of the conductive layer is completed to define a gate electrode having a second width, the second width being less than the first width.

Yet a further object of the present invention is to provide a method for forming a gate electrode of an isolated gate field effect transistor, comprising the steps of forming a gate oxide layer on a silicon substrate, depositing a polycrystalline silicon layer to a predetermined thickness on the surface of the gate oxide layer, forming a first oxide layer on the polycrystalline silicon layer, delineating a gate pattern by a lithography technique, the pre-gate pattern having a first width, etching the first oxide layer to form a first oxide cap patterned to substantially the pre-gate pattern, anisotropically etching a portion of the thickness of the exposed polycrystalline silicon layer to expose at least a portion of a side wall in the polycrystalline silicon layer, oxidizing the polycrystalline silicon layer including the side wall to form a second oxide layer, etching the second oxide layer to re-expose the polycrystalline silicon layer while retaining at least a portion of the first oxide cap, and continued anisotropic etching of the polycrystalline silicon layer to define a gate electrode having a second width smaller than the first width.

Another object of the present invention is to provide a method for forming a transistor, comprised of providing a semiconductor substrate with an insulating layer, a conductive layer deposited on the insulating layer, the conductive layer having a first non-zero thickness, applying a mask having a first transistor electrode width to the conductive layer, etching the conductive layer to reduce an unmasked region of the conductive layer to a second non-zero thickness less than the first thickness and to define a conductive side wall corresponding to the mask, forming an oxide layer by consuming a predetermined portion of the conductive side wall, removing the second oxide layer, and etching the conductive layer to define a transistor electrode having a second width less than the first width after the removing.

A particular object of the present invention is to reduce gate line within to deep submicron widths, and to do so without deep submicron lithography. Similarly, the gate of a charge-coupled device (CCD), or other insulated gate devices, can be patterned to submicron lengths in accordance with the present invention.

Figure 1:
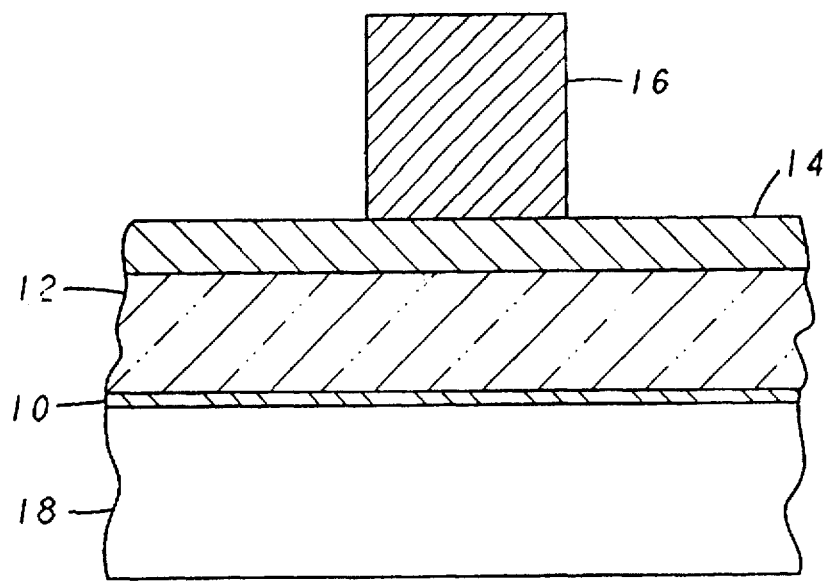
FIGS. 1–6 are cross-sectional views of a portion of an integrated circuit at different stages in manufacturing according to one embodiment of the invention.

For reasons of clarity and simplicity, the elements of the integrated circuit have not necessarily been drawn to scale. For example, the dimensions of some of the elements are exaggerated relative to each other for clarity. Further, where considered appropriate, reference numerals have been repeated among the drawings to indicate corresponding elements.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, any alterations and further modifications in the illustrated device, and any further applications of the principles of the invention as illustrated therein being contemplated as would normally occur to one skilled in the art to which the invention relates.

FIG. 1 depicts a preliminary stage in the formation of a polycrystalline silicon field effect transistor gate on a silicon substrate. The partial cross-sectional view of FIG. 1 schematically depicts a region of a semiconductor suitable for isolation as a corresponding field effect transistor device using techniques known to those skilled in the art. A silicon substrate 18 of p-type conductivity is provided with a gate insulating oxide layer 10. Preferably, gate oxide layer 10 is grown by thermal oxidation, but it may also be provided by known deposition techniques. Typically, it is desirable that gate oxide layer 10 be approximately 50 angstroms thick.

The next step is to deposit a conductive layer above the gate oxide layer 10. In most applications and in the preferred embodiment, the conductor of choice is a polycrystalline silicon layer doped to provided the desired conductivity. However, it is contemplated that materials including silicon and a refractory metal (silicides) may be utilized alone or in combination with polycrystalline silicon for the conductive layer. Some of the more useful silicides include $TiSi_2$, $PtSi_2$, $TaSi$, and $WSi_2$.

In the preferred embodiment, a polycrystalline silicon layer 12 is deposited on gate oxide layer 10. Preferably, the polycrystalline silicon layer is deposited to a thickness of approximately 2500 angstroms, although this may vary depending on the application and the amount of polycrystalline silicon which will be consumed during additional processing. Doping of the polycrystalline silicon layer can occur at this point in the process or after additional processing.

As shown in FIG. 1, a mask oxide layer 14 is grown on polycrystalline silicon layer 12 to a desired thickness by thermal oxidation. Preferably, the thickness of mask oxide layer 14 is between 400 and 2000 angstroms. However, the thickness of mask oxide layer 14 may vary depending on the amount of width to be reduced from the lithography defined pre-gate structure. As will be discussed in greater detail below, the greater the amount of gate width reduction desired, the greater the thickness desired for mask oxide layer 14. Similarly, the thickness of polycrystalline silicone layer 12 may be adjusted to account for material consumed when growing the mask oxide layer. Alternatively, mask oxide layer 14 can be formed by depositing an oxide directly on the polycrystalline silicon by known deposition techniques.

Figure 2:
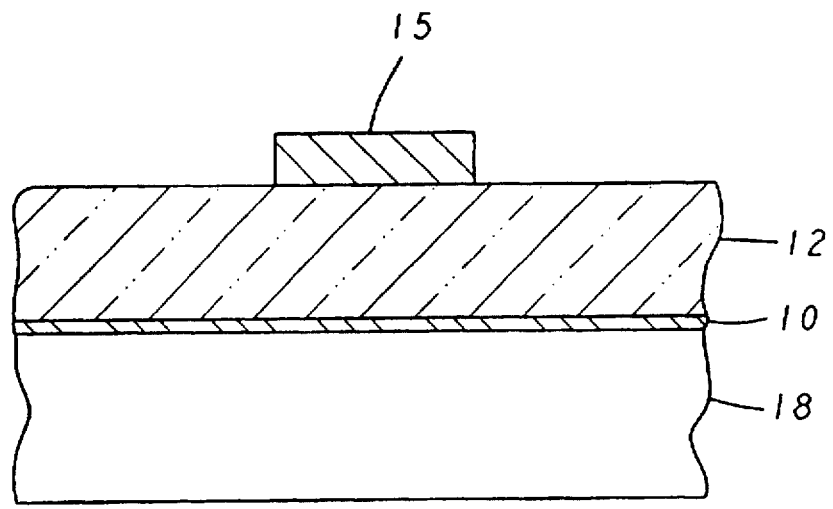

As is well known in the art, a photoresist maskant layer is deposited on the chip and then patterned utilizing lithography or equivalent techniques, thereby patterning the width of the pre-gate structures. The resulting resist mask 16 is shown in FIG. 1. The unmasked portions of oxide layer 14 may then be selectively etched by conventional anisotropic plasma etching using resist layer 16 as a mask. Preferably, as shown in FIG. 2, the resist layer is stripped to expose the remaining oxide cap 15. However, the resist layer may remain in place during additional processing.

In the preferred embodiment chlorine hydrogen bromide ($Cl_2$+HBr) is utilized as the anisotropic etching compound. While this etching material is used in the preferred embodiment, the invention is not limited by the etchant utilized to remove the various layers. It is contemplated that other etching compounds may also be useful in performing the present invention, particularly where alternative materials are used in the layers of the device.

Figure 3:
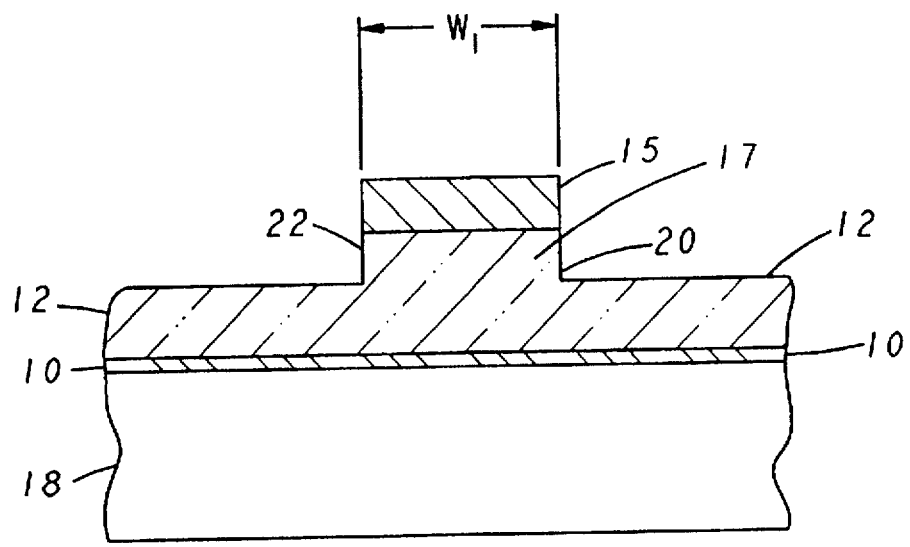

Next, as shown in FIG. 3, partial anisotropic plasma etching with a chlorine hydrogen bromide ($Cl_2$+HBr) solution is conducted on the exposed portion of polycrystalline silicon layer 12 using oxide cap 15 as a mask to pattern the pre-gate structure in the polycrystalline silicon. Polycrystalline silicon layer 12 is anisotropically etched until at least a portion of pre-gate polycrystalline silicon side walls 20 and 22 are exposed to define pre-gate structure 17. The resulting structure is shown in FIG. 3. It will be understood by those skilled in the art that width W1 of pre-gate polycrystalline silicon structure 17 is virtually identical to the width of resist layer 16 defined by lithography and is therefore limited by the capabilities of the lithography equipment and technique utilized in generating the resist mask 16 (FIG. 1). Preferably, approximately 1,000 angstroms of polycrystalline silicon are removed to expose pre-gate side walls 20 and 22. However, it is contemplated that a greater or lesser amount of polycrystalline silicon could be etched to define the pre-gate side walls. Regardless of the depth utilized, it is preferable that the partial etch expose a sufficient depth of polycrystalline silicon to permit effective oxidation of the exposed side walls.

Figure 4:
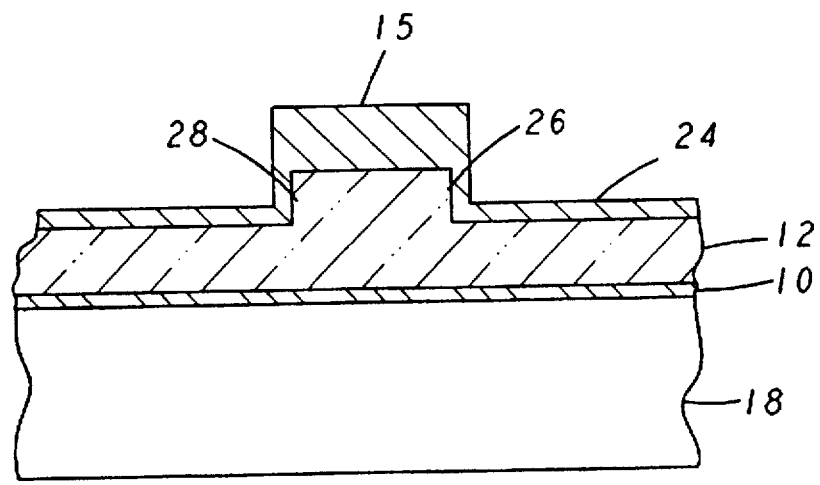

After at least a portion of the polycrystalline silicon layer has been etched to expose the pre-gate side walls, the polycrystalline silicon layer is thermally oxidized to consume the desired amount of polycrystalline silicon. The technique of thermal oxidation is well known and easily controllable to oxidize a desired amount of material. Typically, the thickness of polycrystalline silicon consumed during oxidation process is about half of the oxide thickness grown, but total width reduction of the pre-gate structure will be about twice that because oxide growth occurs on both exposed pre-gate side walls 20 and 22. For example, to achieve a 0.05 μm reduction, a 500 angstrom reduction oxide film will have to be grown. FIG. 4 shows reduction oxide 24 extending over the exposed portions of polycrystalline silicon layer 12 as well as an increased depth in oxide cap 15. In addition to oxide growth on the side walls, oxide cap 15 increases in thickness during the oxidation process, although to a lesser extent.

The structure of FIG. 4 is then chemically wet etched in a conventional buffered hydroflouric acid (HF) solution to remove the newly formed line width reduction oxide 24. Etching of the newly formed oxide 24 re-exposes the underlying polycrystalline silicon surfaces. As shown in FIG. 4, polycrystalline silicon gate side walls 26 and 28 lie beneath line width reduction oxide 24. The wet etching time needed to remove the line width reduction oxide 24 must be adequate to remove the grown oxide thickness and in the preferred embodiment, is extended an additional amount of time to account for process margins to insure complete removal of the line width reduction oxide. For example, a 600 angstrom chemical wet etch would be utilized to remove a 500 angstrom line width reduction oxidation. While it is preferable that the wet etching step continue for a sufficient amount of time to completely remove line width reduction oxide 24, it is preferable that it be halted prior to entirely consuming oxide cap 15 above the polycrystalline silicon gate structure. Oxide cap 15 should have a sufficient thickness to provide a mask during continued etching of the polycrystalline silicon layer. Preferably, oxide cap 15 is between 200 to 1000 angstroms thicker than the oxide grown on the side walls for pre-gate line width reduction. Removal of the reduction oxide layer 24 by etching results in the structure shown in FIG. 5.

Although the preferred embodiment utilizes an oxide mask layer to limit height reduction of the polycrystalline silicon gate during continued etching of the surrounding polycrystalline silicon, it is contemplated that the height of the gate could be established during the initial partial etching and that the height would remain proportional during the final anisotropic etching procedure.

Figure 5:
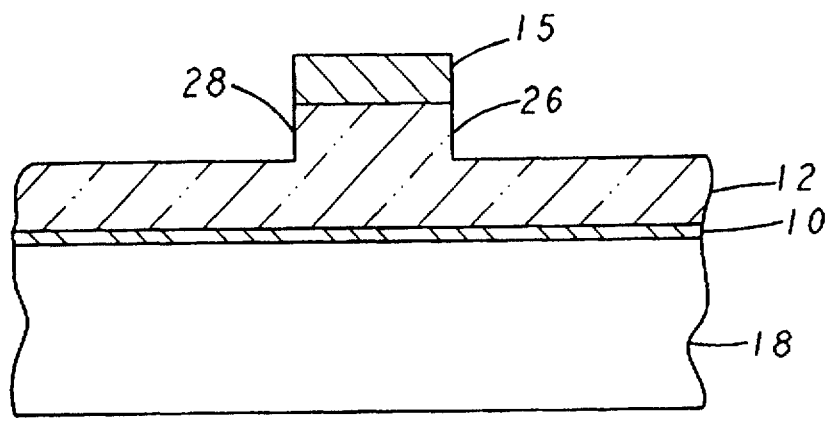
Figure 6:
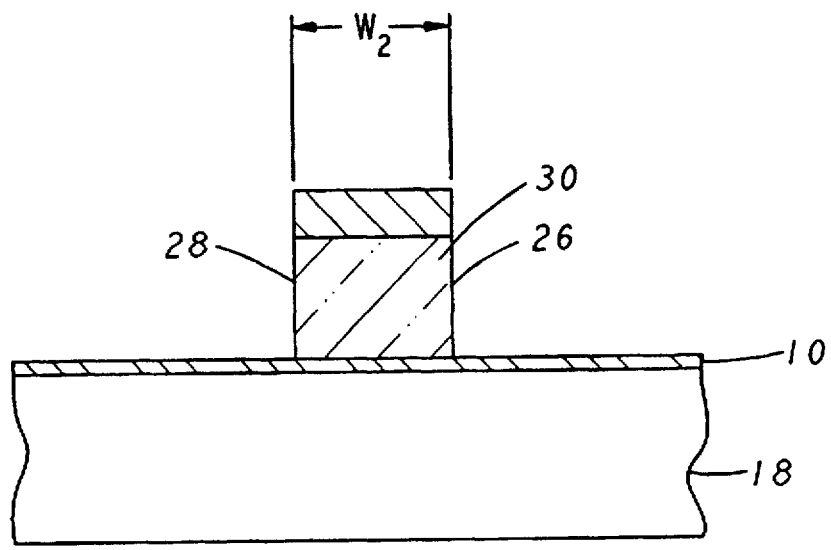

The structure of FIG. 5 is then subjected to continued anisotropic plasma etching to remove the remaining unmasked portion of polycrystalline silicon layer 12 utilizing oxide cap 15 as a pattern. As shown in FIG. 6, the resulting structure is a polycrystalline silicon gate electrode 30 having a width W2 that has been reduced from the width W1 of pre-gate structure 17 as defined by the original lithography masking operation. It will be understood that creation of the polycrystalline silicon gate electrode in this fashion not only limits the potential damage to the gate oxide layer 10 or silicon substrate 18, but also provides a well controlled process for line width reduction. Thermal oxidation and wet etching, particularly in a robotic sink, are well controlled processes, so this technique provides a controlled reduction in width of the polycrystalline silicon gate electrode by partial etch and reoxidation.

While wet etching in a chemical solution is utilized to isotropically remove the line width reduction oxide 24, generally, it is preferred to carry out the remaining etching steps of the method in such a manner as to reduce or eliminate undercutting. That is, an anisotropic etch technique is preferred so that substantially vertical side walls are achieved in each of the etching steps. Specifically, the step of removing a portion of the mask oxide deposited above the polycrystalline silicon layer is carried out with the use of an anisotropic plasma etch so that the resulting step will be substantially free of undercutting, i.e. as nearly perpendicular as is practicably feasible. Also, the subsequent step of partially etching the polycrystalline silicon is preferably carried out with an anisotropic plasma etch so that completion of the partial etching step will insure that the remaining conductor has substantially perpendicular side walls. And finally, when the remaining oxide cap 15 is employed as an etch mask, the use of an anisotropic etch is preferred in the removal of the surrounding unmasked polycrystalline silicon layer so that substantially perpendicular side walls are achieved.

When the above sequence of steps is employed for the fabrication of a MOS field effect device, the substrate is preferably silicon; the gate insulator is preferrably silicon dioxide; the mask oxide layer is preferably silicon dioxide; the deposited conductor is preferably polycrystalline silicon with conductivity adjusted by suitable doping, for example, concurrently with forming source and drain regions.

Although the present invention is described as a method for fabrication of a gate electrode of an isolated field effect transistor, it is contemplated that the present invention may be utilized in fabrication of many types of microelectronic devices. The technique is particularly useful where existing lithography techniques are insufficient to achieve the desired line widths and utilization of more advanced lithography equipment is impracticable.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A method, comprising:
   providing a semiconductor substrate with an insulating layer and a conductive layer deposited on the insulating layer, the conductive layer having a first non-zero thickness;
   applying a mask having a first transistor electrode width to the conductive layer;
   etching the conductive layer to reduce an unmasked region of the conductive layer to a second non-zero thickness less than the first non-zero thickness and to define a conductive layer side wall corresponding to the mask;
   forming an oxide layer by consuming a portion of the conductive layer side wall;
   removing the oxide layer; and
   etching the conductive layer to define a transistor electrode having a second width less than the first width after said removing.

2. The method of claim 1 wherein said conductive layer is doped polycrystalline silicon.

3. The method of claim 1 wherein said conductive layer is a material including silicon and a refractory metal.

4. The method of claim 1 wherein said etching the conductive layer is an anisotropic etch.

5. The method of claim 1 wherein said removing is performed by an isotropic wet etch.

6. The method of claim 1 wherein said applying a mask includes:
    forming a mask oxide layer on said conductive layer;
    applying a photoresist maskant to the mask oxide layer;
    delineating a pattern of at least a first transistor electrode; and
    etching the unmasked mask oxide layer to expose the underlying conductive layer.

7. A method for forming a gate electrode, comprising:
    providing a semiconductor substrate with an insulating layer and a conductive layer deposited thereon;
    generating a mask over the conductive layer delineating a gate electrode pattern having a width and leaving a portion of the conductive layer unmasked;
    partially etching the unmasked conductive layer to expose at least a portion of a side wall defined in the conductive layer;
    oxidizing the conductive layer to form an oxide layer of a thickness after said partially etching;
    removing the oxide layer to expose a remaining unmasked portion of the conductive layer; and
    etching the remaining unmasked portion of the conductive layer to define a reduced width gate electrode.

8. The method of claim 7 wherein said conductive layer is doped polycrystalline silicon.

9. The method of claim 7 wherein said conductive layer is a material including silicon and a refractory metal.

10. The method of claim 7, wherein said partially etching and said etching of the unmasked and the remaining unmasked conductive layer are anisotropic.

11. The method of claim 7, wherein said partially etching removes approximately 1000 angstroms of the unmasked conductive layer.

12. The method of claim 7 wherein said generating a mask includes:
    forming a mask oxide on the conductive layer;
    patterning a photoresist material on the mask oxide to delineate a gate electrode pattern having a width said patterning leaving an unmasked portion of the mask oxide; and
    etching the unmasked portion of the mask oxide to expose a portion of the conductive layer.

13. The method of claim 12 wherein the conductive layer is polycrystalline silicon and the mask oxide is formed by thermal oxidation of the polycrystalline silicon.

14. A method for forming a gate electrode, comprising:
    providing a silicon substrate having an insulating layer, a conductive layer, a first oxide layer and a maskant layer;
    patterning the maskant layer to delineate on the first oxide layer a gate electrode pattern having a first width;
    etching an unmasked area of the first oxide layer;
    partially etching a portion of the conductive layer exposed after etching the first oxide layer, thereby defining at least a portion of a side wall in the conductive layer;
    oxidizing the conductive layer to form a second oxide layer of a thickness after said partially etching;
    removing the second oxide layer to expose a remaining portion of the underlying conductive layer while leaving intact at least a portion of the first oxide layer; and
    etching the remaining portion of the conductive layer to define a gate electrode having a second width, the second width less than the first width.

15. The method of claim 14 wherein said conductive layer is polycrystalline silicon.

16. The method of claim 14 wherein said conductive layer is a material including silicon and a refractory metal.

17. The method of claim 14 wherein said etching the conductive layer is an anisotropic etch.

18. The method of claim 14 wherein said removing the second oxide layer is performed by an isotropic wet etch.

19. A method for forming a gate electrode of an isolated gate field effect transistor, comprising the steps of:
    (a) forming a gate oxide layer on a silicon substrate;
    (b) depositing a polycrystalline silicon layer to a thickness on the surface of the gate oxide layer;
    (c) forming a first oxide layer on the polycrystalline silicon layer;
    (d) delineating a pre-gate pattern by a lithography technique, the pre-gate pattern having a first width;
    (e) etching the first oxide layer to form a first oxide cap patterned to the pre-gate pattern and exposing a portion of the polycrystalline silicon layer;
    (f) anisotropically etching a portion of the thickness of the exposed polycrystalline silicon layer to expose at least a portion of a side wall in the polycrystalline silicon layer;
    (g) oxidizing the polycrystalline silicon layer including the side wall to form a second oxide layer;
    (h) etching the second oxide layer to re-expose the polycrystalline silicon layer while retaining at least a portion of the first oxide cap; and
    (i) continuing anisotropic etching of the polycrystalline silicon layer to define a gate electrode having a second width smaller than the first width after re-exposing the polycrystalline silicon layer.

20. The method of claim 19, wherein said polycrystalline silicon is deposited to a thickness of approximately 2500 angstroms.

21. The method of claim 19, wherein said forming a first oxide layer includes oxidizing the polycrystalline silicon layer.

22. The method of claim 20 wherein said anisotropically etching includes etching approximately 1000 angstroms of the polycrystalline silicon thickness.

23. The method of claim 20 wherein the lithography technique is photolithography.

24. A method of linewidth reduction in fabrication of microelectronic devices, comprising:
    providing a microelectronic device layer having a first non-zero thickness, the layer capable of being oxidized;
    generating a mask over the device layer delineating a pattern of a pre-device structure, the pre-device structure having a first width;
    etching the device layer to reduce an unmasked region of the device layer to a second non-zero thickness less than the first thickness and to define a device layer side wall corresponding to the mask;
    forming an oxide layer by consuming a portion of the device layer side wall;
    removing the oxide layer; and
    etching the device layer to define a device structure having a second width less than the first width after said removing.

25. The method of claim 24, wherein the device structure is a gate electrode of an isolated field effect transistor.

26. The method of claim 24, wherein the device layer is polycrystalline silicon.

* * * * *